United States Patent [19]

Akbar et al.

[11] Patent Number: 4,982,257
[45] Date of Patent: Jan. 1, 1991

[54] VERTICAL BIPOLAR TRANSISTOR WITH COLLECTOR AND BASE EXTENSIONS

[75] Inventors: Shah Akbar, Ithaca, N.Y.; Patricia L. Kroesen, Wallpole, Mass.; Seiki Ogura, Hopewell Junction; Nivo Rovedo, Lagrangeville, both of N.Y.

[73] Assignee: International Business Machines Corporation, Armonk, N.Y.

[21] Appl. No.: 452,450

[22] Filed: Dec. 19, 1989

Related U.S. Application Data

[62] Division of Ser. No. 226,738, Aug. 1, 1988, Pat. No. 4,957,875.

[51] Int. Cl.$^5$ .............................................. H01L 29/72
[52] U.S. Cl. ..................................... 357/034; 357/35; 357/59
[58] Field of Search ............. 357/34, 35, 59 H, 34 HB

[56] References Cited

U.S. PATENT DOCUMENTS

| | | | |
|---|---|---|---|
| 4,195,307 | 3/1980 | Jambotkar | 357/56 |
| 4,299,024 | 11/1981 | Piotrowski | 29/577 |
| 4,475,279 | 10/1984 | Gahle | 29/577 |
| 4,484,388 | 11/1984 | Iwasaki | 29/571 |
| 4,486,942 | 12/1984 | Hirao | 29/571 |
| 4,507,847 | 4/1985 | Sullivan et al. | 29/576 |
| 4,521,952 | 6/1985 | Riseman | 29/590 |
| 4,563,807 | 1/1986 | Sakai et al. | 29/591 |
| 4,637,125 | 1/1987 | Iwasaki | 29/571 |
| 4,642,878 | 2/1987 | Maeda | 29/571 |
| 4,663,831 | 5/1987 | Birrittella et al. | 357/34 X |
| 4,683,487 | 7/1987 | Ueyanagi et al. | 357/34 |
| 4,764,801 | 8/1988 | McLaughlin et al. | 357/34 X |

FOREIGN PATENT DOCUMENTS

63-278370  11/1988  Japan .............................. 357/34 HB

OTHER PUBLICATIONS

Ghosh, "Pedestal Collector Transistor with Retarded Base", *IBM Technical Disclosure Bulletin*, vol. 14, No. 5, Oct., 1971, 1641–1642.
IBM Technical Disclosure Bulletin, vol. 24, No. 10, Mar., 1982, pp. 5123–5126, by C. G. Jambotkar, "Bipolar Transistor Structure".
Patent Abstracts of Japan, vol. 10, No. 259, 4th Sept., 1986; & JP-A-61 85 864 (NEC Corp.), 01/05/86.
IEEE Electron Device Letters, vol. EDL-8, No. 5, May, 1987, pp. 246–248, Hayama et al., "Submicrometer Fully Self-Aligned AlGaAs/GaAs Heterojunction Bipolar Transistor".

*Primary Examiner*—William Mintel
*Attorney, Agent, or Firm*—Jeffrey L. Brandt

[57] ABSTRACT

A compressed vertical bipolar transistor configuration that eliminates one side of the standard symmetrical base contact, while also eliminating the requirement for a collector contact reach-thru. The bipolar transistor comprises: a collector layer; a base layer disposed over the collector layer; an emitter layer disposed over the base layer; a first sidewall insulating layer disposed adjacent to and in contact with one side of the emitter layer, the base layer, and at least a portion of the collector layer; a second sidewall insulating layer disposed adjacent to and in contact with another side of the emitter layer and at least a portion of the base layer; and a base contact extension layer formed from heavily doped semiconductor material of the same conductivity type as the base layer, said base contact extension layer being in contact with an extending laterally from another side of the base layer. The structure further includes a base contact interconnect disposed on a surface of the base contact extension layer and; a collector contact extension layer formed from doped semiconductor material with the same conductivity type as the collector layer, with the collector contact extension layer being in contact with the collector layer and extending laterally from or below the one side thereof; and a collector contact interconnect disposed on a surface of the collector contact extension layer and separated from said emitter layer by only one or more insulating layers.

16 Claims, 3 Drawing Sheets

4,982,257

VERTICAL BIPOLAR TRANSISTOR WITH COLLECTOR AND BASE EXTENSIONS

This application is a divisional application of Ser. No. 226,738 filed Aug. 1, 1988 now U.S. Pat. No. 4,957,875, issued Sept. 18, 1990.

BACKGROUND OF THE INVENTION

The present invention relates generally to bipolar transistors, and more particularly to an advanced vertical bipolar transistor structure and process.

A basic goal in bipolar circuit design is to reduce the circuit power consumption while, at the same time, increasing the speed of operation. One way to reduce power consumption is to utilize BIFET (bipolar and FET) circuits. To this end, it is highly desirable that any bipolar process be compatible with FET processing so that BIFET (bipolar and FET) chip configurations can be implemented. However, these design goals must be implemented with a transistor fabrication process that is economical.

The invention as claimed is intended to provide a bipolar transistor which offers increased speed of operation. An advantage offered by the present invention is that the need for a subcollector reach-thru contact is eliminated. A further advantage of the present invention is the overall width of the transistor is reduced by eliminating the need for the standard base contact that is normally disposed between the emitter and collector contacts. An additional advantage of the present invention is that a very narrow emitter is utilized, effectively resulting in a reduction of the problems associated with intrinsic base resistance and a minimization of emitter-base capacitance. Moreover, the process that may be used to implement the transistor design of the present invention is relatively simple and is compatible with FET processing.

SUMMARY OF THE INVENTION

A new and improved vertical bipolar transistor is provided, including: a substrate of semiconductor material; an epitaxial region of semiconductor material on the substrate; a subcollector layer of first conductivity type formed in the epitaxial region; a collector layer of the first conductivity type disposed over the subcollector layer in the epitaxial region; a base layer of a second conductivity type disposed over the collector layer in the epitaxial region; an emitter layer of semiconductor material of the first conductivity type disposed over the base layer; the epitaxial region including a base extension layer of the second conductivity type and with a dopant concentration greater than the base dopant concentration disposed laterally adjoining one side of the base layer and having a top surface below the bottom surface of the emitter layer and above the top surface of the collector layer; a first sidewall insulator layer disposed laterally adjacent to and in contact with the emitter layer and on the same side thereof as the base extension layer; a base contact interconnect disposed on the top surface of the base extension layer and separated from the emitter layer by the first sidewall insulator layer; the epitaxial region including a subcollector extension layer of the first conductivity type and with a dopant concentration greater than the dopant concentration of the subcollector layer disposed laterally adjoining the subcollector layer and on another side of the emitter from the base extension layer, the subcollector extension layer having a top surface that is below the top surface of the collector layer; a second sidewall insulator layer disposed laterally adjacent to and in contact with the emitter layer, the base layer, and at least a portion of the collector layer, and on the another side of the emitter layer; and a collector contact interconnect disposed on the top surface of the collector extension layer and separated from the emitter layer by the second sidewall insulator layer.

In accordance with another aspect of the present invention, there is provided a new and improved bipolar transistor, including: a substrate of silicon semiconductor material; an epitaxial region of silicon semiconductor material on the substrate; a collector layer of first conductivity type formed in the epitaxial region; a base layer of a second conductivity type disposed over the collector layer in the epitaxial region; an emitter layer of doped polysilicon semiconductor material of the first conductivity type disposed over the base layer; a first sidewall insulator layer disposed adjacent to and in contact with one side of the emitter layer and at least a portion of the collector layer; a second sidewall insulator layer disposed adjacent to and in contact with another side of the emitter layer and at least a portion of the base layer; the epitaxial region including a base contact extension layer of the same conductivity type as the base layer in contact with and extending laterally from the another side of the base layer; a base contact interconnect disposed on a surface of the base contact extension layer and separated from the emitter layer by the second sidewall insulating layer; the epitaxial region including a collector contact extension layer of the same conductivity type as the collector layer in contact with the collector layer and with a volume thereof extending laterally to the one side of the emitter layer; and a collector contact interconnect disposed on a surface of the collector contact extension layer and disposed adjacent to and separated from the emitter layer by the first sidewall insulator layer.

BRIEF DESCRIPTION OF THE DRAWINGS

FIG. 10A is a schematic diagram of the device configuration after the performance of one step in a process to prevent low E-C punch-through.

DETAILED DESCRIPTION OF THE PREFERRED EMBODIMENT

Figure 1:
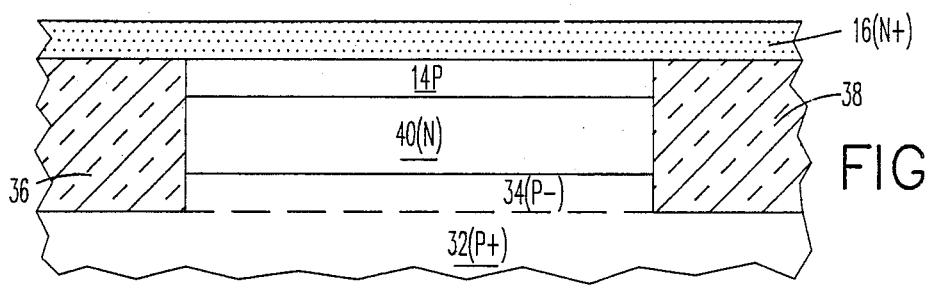
FIG. 1 is a schematic diagram of a semiconductor substrate during an initial part of the inventive process.

The present invention is illustrated, for convenience, in the context of an NPN transistor configuration. It is understood by one skilled in the art that the present invention is not limited to this particular configuration, but may take a variety of other configurations including PNP transistor configurations. Additionally, the present invention is not restricted to the particular dimensions and proportions shown in the drawings. The present invention may be implemented in a number of different semiconductor materials including Si and GaAs.

Figure 8:
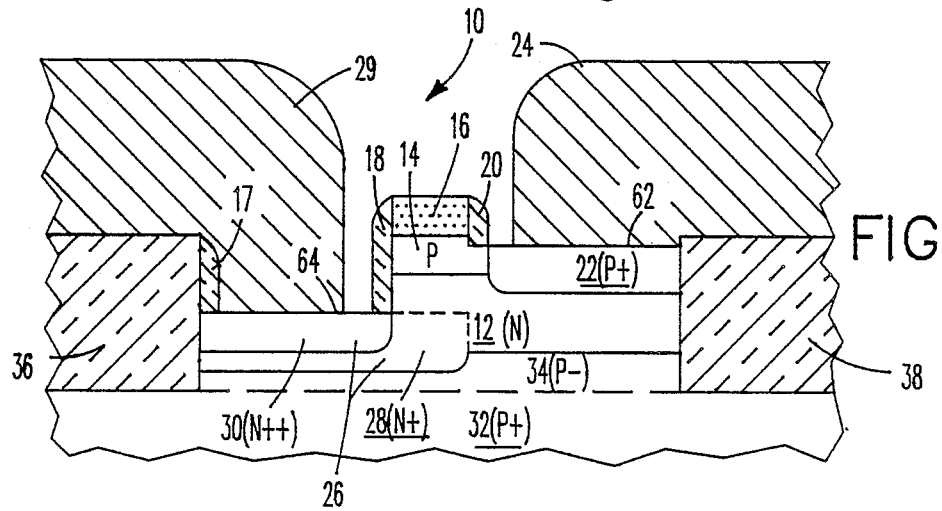
FIG. 8 is a schematic diagram of the transistor resulting from the present inventive process.

Referring now to FIG. 8, there is shown the bipolar transistor configuration 10 of the present invention. This transistor comprises a collector layer 12, a base layer 14 disposed over the collector layer 12, and an emitter layer 16 disposed over the base layer 14. The transistor configuration further includes a sidewall insulator layer 18 disposed adjacent to and in contact with the one side of the emitter layer 16, the base layer 14, and at least a nominal portion of the collector layer 12. The configuration further includes a second sidewall insulating layer 20 disposed adjacent to and in contact with another side of the emitter layer 16 and at least a nominal portion of the base layer 14. Note that in the embodiment shown in FIG. 8, this other side of the emitter layer is conveniently the opposite side from the one side of the emitter layer where the first sidewall insulating layer 18 is disposed. The transistor configuration further includes a base contact extension layer 22 formed from heavily doped semiconductor material of the same conductivity type as the base layer 14, in contact with and extending laterally from another side of the base layer 14. A base contact interconnect 24 is disposed on the top surface 62 of the base contact extension layer 22, separated from the emitter layer by only one or more insulating layers. The configuration further includes a collector contact extension layer 26 formed from heavily doped semiconductor material with the same conductivity type as the collector layer 12, with the collector contact extension layer 26 being in contact with the collector layer and extending laterally from or below the one side thereof. It can be seen that this collector contact extension layer 26 in the embodiment shown in FIG. 8 actually contacts the bottom surface of the collector layer 12 and extends laterally to the left of the transistor configuration. Finally, a collector contact interconnect 29 is disposed on the collector contact extension layer 26 on the contact surface 64, separated from the emitter layer 16 by only one or more insulating layers.

It should be noted that in a preferred embodiment, the collector contact extension layer 26 comprises a first portion 28, which is a subcollector layer, disposed directly below and in contact with the collector layer 12 and having a first dopant concentration, and a second portion 30 with a dopant concentration which is greater than the first dopant concentration and which is disposed directly below the surface 64 of the collector contact extension layer in the volume which extends to one side of the collector layer 12.

By way of illustration, and not by way of limitation, the embodiment shown in FIG. 8 utilizes a collector layer 12 which is doped to an N-concentration, a base layer 14 which is doped to a P concentration, emitter layer 16 which is doped to an N+ concentration, a base contact extension layer 22 which is doped to a P+ concentration, and a collector contact extension layer 26 with a first portion 28 thereof (the subcollector layer) doped to an N+ concentration and a second portion 30 thereof which is doped to an N++ concentration.

By way of example, the present bipolar transistor configuration shown in FIG. 8 may be formed on a P+ substrate 32 with a P− epitaxial layer 34 grown thereon. An isolation scheme using some form of insulator portions 36 and 38 is shown in the Figure to provide isolation of the bipolar transistor 10 from other chip components. In the embodiment of FIG. 8, the base insulator portions 36 and 38 may simply be formed by volumes of $SiO_2$.

The above-described bipolar transistor configuration significantly reduces the width of the overall transistor by eliminating the inside base contact normally situated between the emitter and collector contacts. This reduced transistor width significantly increases the number of active devices which can be integrated onto a chip.

A preferred process for fabricating the transistor configuration of FIG. 8 will now be described with reference to FIGS. 1-7. Referring first to FIG. 1, the process begins with a P+ substrate 32 with a P− epitaxial layer 34 grown thereover. The steps required in order to obtain a P− epitaxial layer growth are well known in the art and reference is made to *VLSI Technology* by S.M. SZE, Chap. 2, Wiley & Sons.

Some form of isolation scheme may be conveniently executed at this point in the process. By way of example, this isolation scheme may comprise a fully recessed oxide type of isolation, a more conventional semi-ROX isolation, some type of trench isolation, or a variety of other different isolation configurations utilizing available insulation materials. For simplicity of explanation of the present invention, a fully recessed oxide isolation scheme is shown in FIG. 1. The recessed oxide layers are represented in FIG. 1 by the areas 36 and 38.

After the formation of the isolation scheme volumes, the volume 40 which will eventually include the collector region 12 (not shown in FIG. 1) is formed on on the P− epi layer 34. This region 40 is formed by doping the region with an appropriate dopant to a desired concentration. For the present example embodiment of an NPN transistor, the region 40 is doped with an N−type dopant such as phosphorus to a concentration of 1E17 per cubic centimeter. A variety of methods of doping may be utilized to obtain the region 40 including ion implantation. The depth of the implant is based on design considerations and may typically be on the order of 6000 Angstroms.

After the N− region 40 is formed, a region 14 which will become the base layer must be formed thereover. By way of example, a P type ion implant may be utilized to form a P doped region 14 to a depth of about 2000 Angstroms.

The next region to be formed is to be used to implement the emitter layer 16. This layer 16 may be formed by using either an additional N+ doping step, or by depositing an additional N+ doped layer thereover. In the present embodiment, an N+ doped layer of polysilicon is deposited over the wafer to form the emitter layer 16. The thickness for this emitter layer 16 may be on the order of 1500 Angstroms.

In a preferred embodiment, it is desirable to have a very narrow-width emitter A narrow-width emitter is advantageous because it significantly reduces the area component of capacitance between the emitter and the base without an overly severe increase of the resistance of the configuration. In this regard, most of the current flows through the edge regions of the emitter and the base, with the center region thereof contributing only a nominal amount of current to the device operation. Thus, the reduction of the emitter width does not affect the current flow while significantly reducing the capacitance of the device. In essence, the narrow emitter configuration uses the fact that a typical emitter-base diode junction is heavily turned on only in the region close to the base contacts, to provide a design which reduces the device capacitance.

In order to obtain this narrow-width emitter layer 16, a variety of different techniques may be utilized. In a preferred embodiment, a technique called sidewall image transfer may be used. This technique is described in detail in U.S. Pat. No. 4,648,937.

Figure 2:
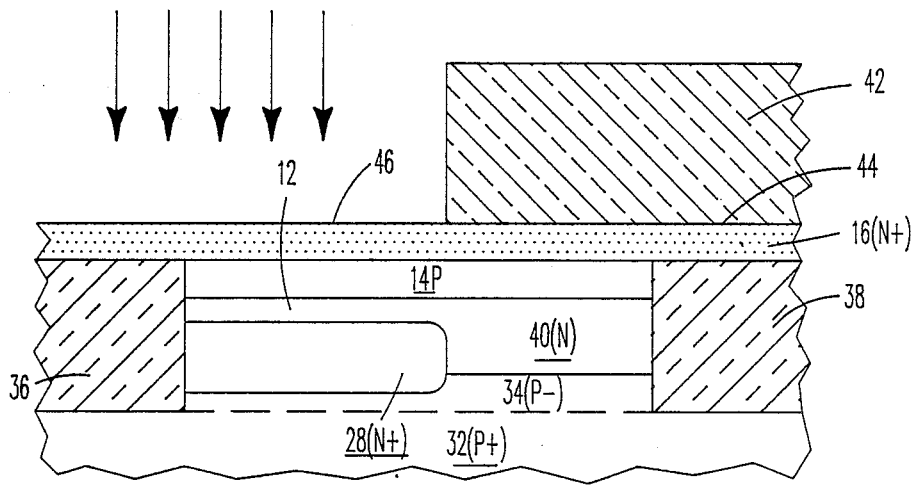
FIG. 2 is a schematic diagram of the semiconductor substrate after a step has been disposed thereover.

Referring now to FIG. 2, the sidewall image transfer technique may be implemented by first forming a step 42 of insulating material, such as an organic material, over a first portion 44 of the top surface of emitter layer 16, but not over a second portion 46 thereof. The step 42 may be formed by means of standard lithography techniques. The step thickness will typically be on the order of 2.0 microns.

At this point in the process, a subcollector region 28 may be formed in the device in the region below the second portion 46 of the top surface of the emitter layer 16. This subcollector formation may be accomplished, by way of example, by means of a relatively high-energy ion implantation to form the subcollector layer 28. By way of example, an ion implantation with phosphorus ions with energies of on the order of 700KeV with may be utilized. It should be noted that the subcollector region could have been formed by means of some form of deposition or doping step at an earlier point in the process. The present invention is not limited to the particular method or the timing, at which the subcollector layer is formed in the device. Note that because the step 42 is on the order of 2.0 microns in thickness, none of the phosphorus ions penetrate into the silicon area beneath the step 42. The ion implantation energy is also low enough to maintain an N doped layer 12 between the subcollector layer 28 and the base layer 14. Note that the appropriate dosage may be calculated for different transistor configurations by means of standard LSS statistical analysis using Gaussian distribution information.

Figure 3:
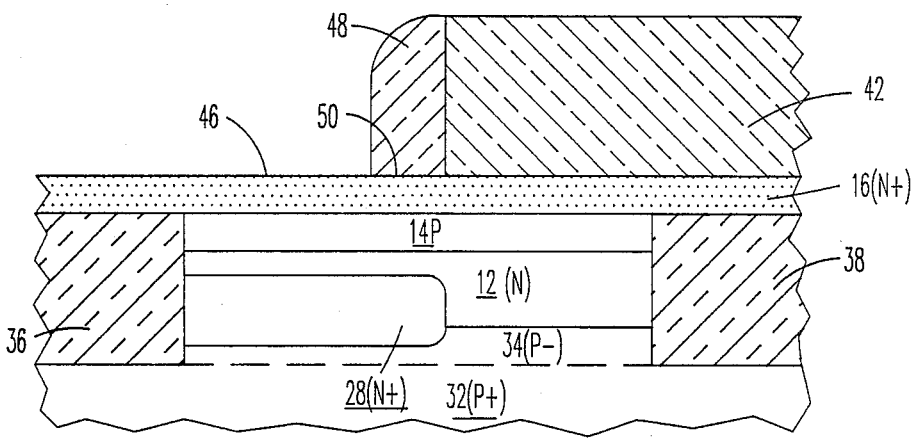
FIG. 3 is a schematic diagram of the substrate after a spacer has been disposed adjacent to the step.

Referring now to FIG. 3, the next step in forming the present bipolar transistor configuration is to form a sidewall spacer 48 of insulating material against the sidewall of the step 42 to thereby cover a third portion 50 of the top surface of the emitter layer 16, which third portion 50 is less in area than the second portion 46. By way of example, this sidewall spacer formation may be accomplished coating the configuration of FIG. 2 with a layer of some form of insulating material such as $SiO_2$ or $Si_3N_4$ to a thickness which may be on the order of 5000 Angstroms. This coating may be applied by means, for example, of a plasma deposition. If an organic material is utilized to form the step 42, then it should be noted that the maximum temperature of this deposition for the insulating layer should be limited. In this regard, it is noted that excellent conformality of $SiO_2$ or $Si_3N_4$ is achieved at temperatures of less than 300° C. It has been found that such temperatures do not adversely affect the organic material of the step 42.

A directional dry etch (RIE) of the plasma deposited insulating layer is then used to remove the horizontal portions of this insulating layer while leaving the spacer 48 disposed against the edge of the step material 42. The horizontal width of the spacer 48 depends primarily on the thickness of the deposition of the insulating layer, on the system's conformality, and on the directionality of the etch medium utilized. In this configuration, the preferred etch should be selective to polysilicon. By way of example, a $CF_4+H_2$ mixture may be utilized as the etching gas. The resulting spacer 48 will have a width of on the order of 5000 Angstroms.

Figure 4:
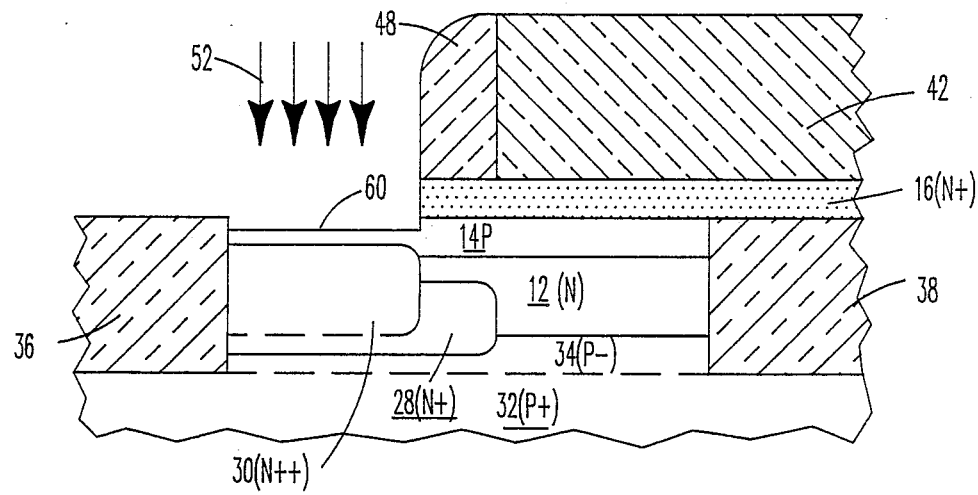
FIG. 4 is a schematic diagram of the semiconductor substrate after etching and ion implantation steps have been performed.

The next step in forming the transistor configuration of the present invention is illustrated in FIG. 4 and comprises removing the emitter layer 16 and at least a nominal portion of the base layer 14 in a first volume directly adjacent to the sidewall spacer 48. This removal step may be accomplished conveniently by a selective etch of the polysilicon layer 16. A typical selective etching medium that may be utilized is Freon $11+N_2+O_2$ or Freon $11+AIR$. Utilizing this etching medium, the spacer will only be minimally etched and will remain in tact. Note that the standard overetch of the polysilicon layer 16 into the P base layer 14 will not adversely affect the device configuration.

It is desirable to raise the concentration of the subcollector region 28 where it extends out from under the spacer region 48. The purpose of this increase in concentration is to lower the contact resistance to this area. This increase in concentration may be accomplished conveniently by an ion implantation (represented by the arrows 52 in FIG. 4) into that region adjacent to the spacer 48. By way of example, an ion implantation of phosphorus ions at an energy of on the order of 200KeV may be utilized in order to increase the doping concentration in the area 30 adjacent to the sidewall spacer to a concentration of $N++$. Typically, this raised concentration in the region 30 will be in the range of 1E20 per cubic centimeter.

Figure 5:
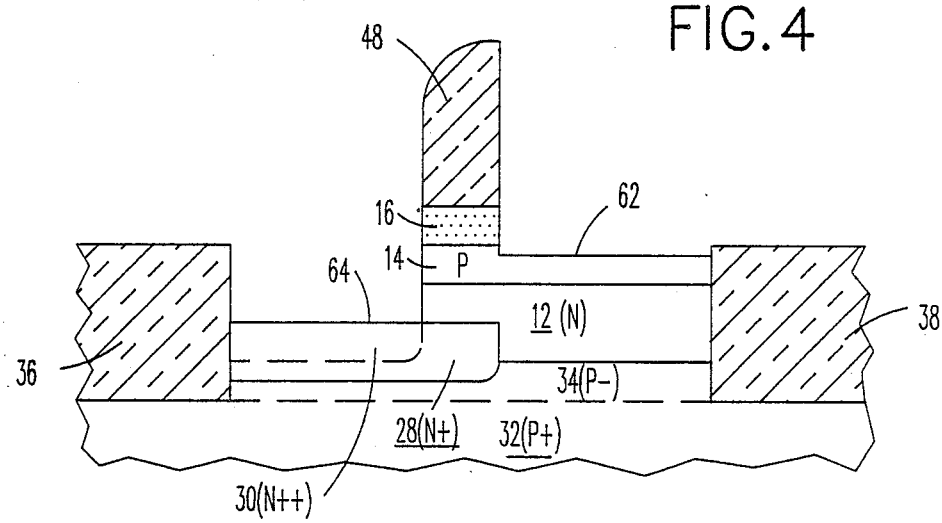
FIG. 5 is a schematic diagram of the semiconductor substrate after removal of the step and after a second etching procedure has been performed.

At this point in the process it is desirable to remove the step 42. A variety of different procedures may be utilized to remove the step 42 depending on the step material. By way of example, for an organic step material, the step may be removed simply by ashing in an oxygen plasma. The resulting configuration is shown in FIG. 5.

After the removal of the step 42, it is now desirable to remove the emitter layer and a portion of the base layer in a second volume below the removed step 42 in order to expose the base layer 14 and provide a base contact surface 62. This emitter layer removal may be accomplished simply by an etch step formulated to remove the particular material used for the emitter. In the present example, the polysilicon layer 16 below the step may be reactive ion etched using a gas mixture of $SF_6+Cl_2$ or $Fr_{11}O_2+N_2$. During this etching step, in a preferred process embodiment, the silicon surface on the other side of the sidewall spacer 48 continues to be exposed. Accordingly, the reactive ion etching gas operates to etch this silicon down to the implanted $N++$ region 30. The resulting configuration at this point in the process is shown in FIG. 5. It can be seen that the top surface 64 of the $N++$ region 30 is now exposed. Additionally, it can be seen that the P region 14 on the other side of the spacer 48 is exposed at the surface 62.

Figure 6:
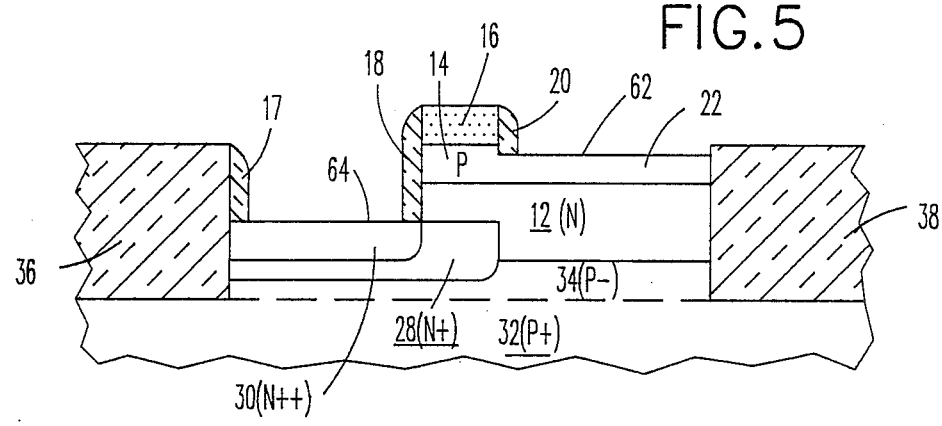
FIG. 6 is a schematic diagram of the semiconductor substrate after the formation of sidewall insulator layers.

Referring now to FIG. 6, the next step in the process is to remove the sidewall spacer 48. It is preferred that a selective etch formulated to only select the sidewall spacer material be utilized. In the present example embodiment, an HF etch may be utilized for $SiO_2$, or a hot $H_3PO_4$ etch may be utilized for $Si_3N_4$. In the present example, an HF etch mixture was utilized to remove an $SiO_2$ sidewall spacer 48. It should be noted that plasma-generated $SiO_2$ etches more quickly than thermally grown $SiO_2$ or LPCVD $SiO_2$ deposited and densified at higher temperatures. Accordingly, the removal of the plasma-deposited spacer 48 does not thin the isolation regions 36 and 38 to any hazardous extent. Note that if $Si_3N_4$ had been used, the suggested $H_3NO_4$ etch does not harm $SiO_2$ at all, and the temperature for this etch can be lowered to avoid etching the N+ polysilicon if there is any sensitivity in this area.

At this point in the process, it is convenient to define the thin emitter length. There are a variety of different methods which may be utilized to define the emitter length. By way of example, a photoresist mask may be applied on the emitter and a selective reactive ion etch of the polysilicon utilized to remove sections of the polysilicon 16 where it is desired to cut the polysilicon line. This step is required because of the inherent nature of sidewall image transfer. In this regard, the sidewall image transfer process typically results in the formation of a sidewall in a closed shape around a particular step. Accordingly, all of the submicron width sidewall lines are formed in closed shapes. A photoresist mask must thus be used in order to remove those portions of the closed shape which are not desirable for the device configuration. The resulting emitter line length may be on the order of 1.0 micron or less.

At this point in the process it is desirable to form, preferably simultaneously, a set of insulator sidewalls to insulate the sides of the emitter, base, and collector which are exposed. Referring now to FIG. 6, a first insulator sidewall 18 is formed in the first volume adjacent to and in contact with one side of the emitter layer 16, the base layer 14, and at least a nominal portion of the collector layer 12 and touching the collector contact surface 64. Simultaneously, a second insulator sidewall 20 is formed in the second volume adjacent to and in contact with another side of the emitter layer 16, and at least a nominal portion of the base layer 14, and touching the base contact surface 62. In a preferred embodiment, these insulator sidewalls 18 and 20 may be formed simply by coating the configuration with an approximately 2000 Angstrom thick deposition oxide (plasma $SiO_2$ or TEOS). A directional etch using, for example, a reactive ion etching gas mixture of $CF_4+H_2$ may be utilized to form the spacers on the sides of the emitter 16 used to provide the isolation for the vertical edge of the device. Note that the asymmetry in the contact surface height on either side of the emitter does not adversely affect the spacer formation.

A shallow P+ type implant is then used to raise the P type doping concentration in the base contact extension layer 72. The energy of the ion implant is chosen so that it does not penetrate the N+ polysilicon emitter layer 16 and the ion dosage is designed so that it doesn't compensate either the N+ emitter polySi or the N++ doping of the region 30 in the collector contact extension layer 26, but will effectively raise the doping level of the extrinsic base for contact purposes. By way of example, as an implant energy of 40KeV of BF2 ions at a dosage of 8E14 per square centimeter may be utilized.

Figure 7:
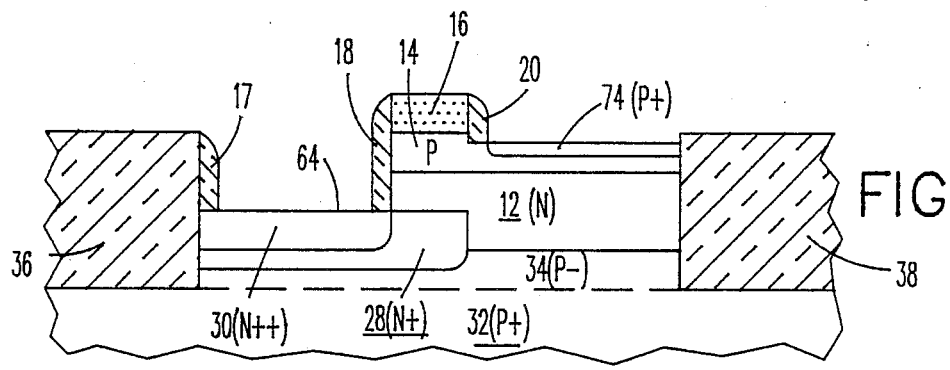
FIG. 7 is a schematic diagram of the semiconductor substrate after the formation of a P+ region adjacent to the base layer.

The result of this ion implantation step is a P+ layer 74, shown in FIG. 7. A rapid thermal anneal may then be performed to activate the P+ dopant (cause the dopant atoms to introduce holes) without any considerable junction movement to thereby form the base contact extension layer 22.

In order to form appropriate device contact interconnects, a silicide is generally formed over the collector, emitter, and base contact surfaces. By way of example, Ti or some other silicide-forming metal may be deposited and reacted with the exposed silicon on the contact surfaces to provide self-aligned silicide over the collector, emitter, and base contact surfaces. The unreacted metal is then removed selectively, leaving the silicide. Well-known processes may be used to form the contact interconnects to these self-aligned silicide contact layers.

Figure 9:
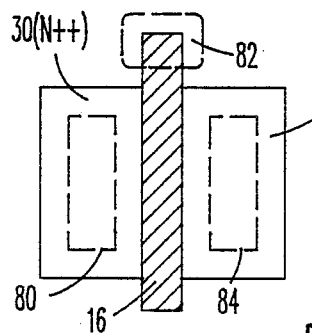
FIG. 9 is a schematic top-view of the transistor formed in accordance with the present process.

The resulting device has a contact to the collector layer 12 by means of the collector contact extension layer 26 (28 and 30). A contact to the base layer 14 is obtained by means of the base contact extension layer 22, and contact to the emitter 16 is obtained by direct contact to the polysilicon line forming the emitter when the line is brought out onto an isolation region. A top view of this contact structure is shown in FIG. 9. The emitter polysilicon line 16 is shown in the center of the Figure. The N++ surface 64 for the collector contact extension layer 26 is shown to the left of the submicron emitter 16. Likewise, the top surface 62 for the P+ region of the base contact extension layer 22 is shown to the right of the submicron emitter line 16. The contact hole for the collector is designated 80, the contact hole for the emitter is designated 82, and the contact hole for the base is designated 84.

It is noted that in some instances it is possible that there can be leakage from the emitter layer 16 to the collector layer 12 by means of a parasitic vertical FET device formed on the edge of the base layer 14. This parasitic FET device may be formed if the sidewall adjacent to the base becomes inverted. In particular, this inversion may be caused by the low doping level of the base layer 14 and the increased surface state level present on the edge of the base layer 14. Both of these factors tend to reduce the threshold voltage for charge leakage thereacross. Thus, the base sidewall surface can invert causing a low current path from the emitter 16 to the collector 12. Alternatively, there may be E-C punch-through. In order to avoid this inversion and leakage or punch-through problem, the sidewall spacers 18 and 20 shown in FIG. 8 could be doped spacers in order to inhibit inversion adjacent to the vertical base edge. By way of example, the sidewall spacers 18 and 20 may be formed of borosilicate glass. After the spacers 18 and 20 are in place, a low temperature of on the order of 800° C. may be used to drive in the boron from the spacer to the silicon vertical edge of the base 14. This drive-in of the boron to the base vertical edge effectively raises the base doping at the edge which is in contact with the oxide spacer, thereby inhibiting inversion thereof. However, the amount of boron used in the borosilicate glass would not be sufficient to cause compensation at the vertical sidewall edge for either the collector 12 or the emitter 16. A preferred borosilicate glass concentration is 4%.

Figure 10A:
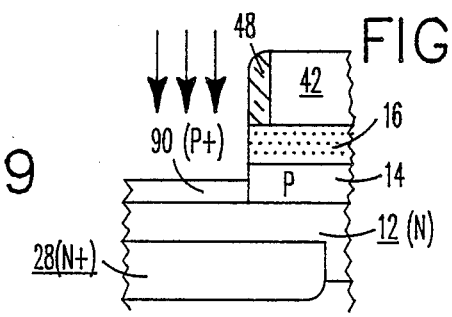
Figure 10B:
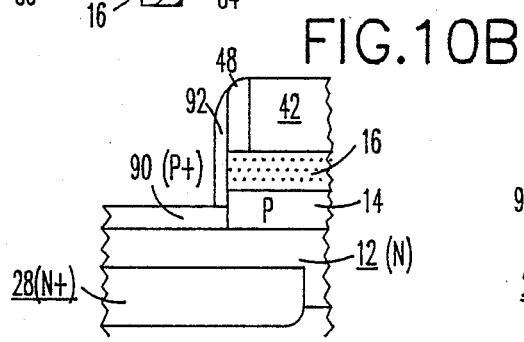
FIG. 10B is a schematic diagram of the device configuration after the performance of a second step in a process to prevent low E-C punch-through in the transistor.
Figure 10C:
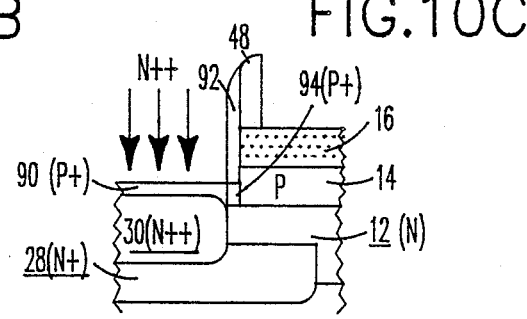
FIG. 10C is a schematic diagram of the device configuration after the performance of a third step in a process to prevent low E-C punch-through in the transistor.

Another method which could be utilized before the N++ implant step shown in FIG. 4 has been performed, is illustrated in FIG. 10A. In FIG. 10A a P+ type implant 90 is formed on the volume directly below the surface 60. This P+ type implant may be implemented by boron ions at a concentration of 1E14 per cubic centimeter. This P+ implant is then followed by the formation of an additional spacer 92 in order to widen the already existing spacer 48. The formation of this additional spacer 92 may be accomplished by depositing a desired thickness of a spacer material, for example, 1000 Angstroms, and then directionally etching that deposited layer to leave only the vertical spacer 92. When the subsequent N++ implant step is performed in FIG. 4 in order to form the highly doped region 30, and the polySi emitter layer 16 is etched above the base region 62 in FIG. 5, the P+ doped region 90 will be eliminated, except for the P+ doped region 94 disposed directly below the additional spacer 92. This additional P+ doped region 94 disposed adjacent to the vertical edge of the base layer 14 will inhibit the inversion of the vertical wall of this base layer. The additional spacer 92 is removed with the previously existing spacer 48.

The present inventive structure and process yields a device configuration which significantly enhances the number of transistors which may be formed on a given substrate. In particular, the present configuration avoids the use of the standard symmetric base contact on either side of the emitter, and also avoids the use of the standard reach-thru contact to the subcollector. In one embodiment of this configuration, the base contact extension layer is at a higher level than the collector contact extension layer.

The structure resulting from the present invention has high performance. The described process advantageously uses sidewall image transfer to form very narrow emitters of on the order of 0.4 microns or less. These narrow emitters lead to the high performance characteristic. Additionally, these narrow emitters reduce the base resistance and minimize parasitic capacitance due to the reduced area of the base so that the performance is increased to on the order of 40 gigahertz or greater.

An additional point with respect to the present invention is that the processing for the device configuration is relatively simple compared to other advanced bipolar structures. For example, there is no reach-thru structure. Additionally, no high temperature drive-in steps are required for the subcollector in the present configuration. Finally, in the embodiment of the invention wherein the subcollector is implanted, no epitaxial growth is required after the subcollector is formed. This fabrication methodology is compatible with FET type processes.

While the present invention has been particularly shown and described with reference to preferred embodiments therefor, it will be understood by those skilled in the art that the foregoing and other changes in form and detail will be made therein without departing from the scope and spirit of the present invention.

We claim:
1. A vertical bipolar transistor, comprising:
a substrate of semiconductor material;
an epitaxial region of semiconductor material on said substrate;
a subcollector layer of first conductivity type formed in said epitaxial region;
a collector layer of said first conductivity type disposed over said subcollector layer in said epitaxial region;
a base layer of a second conductivity type disposed over said collector layer in said epitaxial region;
an emitter layer of semiconductor material of said first conductivity type disposed over said base layer;
said epitaxial region including a base extension layer of said second conductivity type and with a dopant concentration greater than said base dopant concentration, disposed laterally adjoining one side of said base layer and having a top surface below the bottom surface of said emitter layer and above the top surface of said collector layer;
a first sidewall insulator layer disposed laterally adjacent to and in contact with said emitter layer and on the same side thereof as said base extension layer;
a base contact interconnect disposed on said top surface of said base extension layer and separated from said emitter layer by said first sidewall insulator layer;
said epitaxial region including a subcollector extension layer of said first conductivity type and with a dopant concentration greater than the dopant concentration of said subcollector layer disposed laterally adjoining said subcollector layer and an another side of said emitter from said base extension layer, said subcollector extension layer having a top surface that is below the top surface of said collector layer;
a second sidewall insulator layer disposed laterally adjacent to and in contact with said emitter layer, said base layer, and at least a portion of said collector layer, and on said another side of said emitter layer; and
a collector contact interconnect disposed on said top surface of said collector extension layer and separated from said emitter layer by said second sidewall insulator layer.

2. A vertical bipolar transistor as defined in claim 1, wherein said second sidewall insulator layer extends down so that the bottom thereof ends on said top surface of said subcollector extension layer.

3. A vertical bipolar transistor as defined in claim 2, wherein said first sidewall insulator layer extends down so that the bottom thereof ends on said top surface of said base extension layer.

4. A vertical bipolar transistor as defined in claim 3, wherein said first and second sidewall insulator layers are disposed on opposite sides of said emitter layer.

5. A vertical bipolar transistor as defined in claim 1, wherein there is an emitter contact interconnect disposed on said emitter layer and separated from said collector contact by at least one insulating layer.

6. A vertical bipolar transistor as defined in claim 1, wherein said emitter layer has width of less than one micron.

7. A vertical bipolar transistor as defined in claim 1, wherein said subcollector layer is doped to at least an N+ concentration said, collector layer is doped to an N concentration, said base layer is doped to a P concentration, said emitter layer is doped to an N+ concentration, said base extension layer is doped to a P+ concentration, and said subcollector extension layer is doped to an N++ concentration.

8. A vertical bipolar transistor as defined in claim 1, wherein the top surface of said base extension layer is above the top surface of said subcollector extension layer.

9. A bipolar transistor, comprising:
a substrate of silicon semiconductor material;
an epitaxial region of silicon semiconductor material on said substrate;
a collector layer of a first conductivity type formed in said epitaxial region;
a base layer of a second conductivity type disposed over said collector layer in said epitaxial region;
an emitter layer of doped polysilicon semiconductor material of said first conductivity type disposed over said base layer;
a first sidewall insulating layer disposed adjacent to and in contact with one side of said emitter layer, said base layer, and at least a portion of said collector layer;
a second sidewall insulating layer disposed adjacent to and in contact with another side of said emitter layer and at least a portion of said base layer;
said epitaxial region including a base contact extension layer of the same conductivity type as said base layer in contact with and extending literally rom said another side of said base layer;
a base contact interconnect disposed on a surface of said base contact extension layer and separated from said emitter layer by said second sidewall insulating layer;
said epitaxial region including a collector contact extension layer of the same conductivity type as said collector layer in contact with said collector layer and with a volume thereof extending laterally to said one side of said emitter layer; and
a collector contact interconnect disposed on a surface of said collector contact extension layer and disposed adjacent to and separated from said emitter layer by said first sidewall insulating layer.

10. A bipolar transistor as defined in claim 9, wherein the top surface of said collector contact extension layer is below the top surface of said base contact extension layer.

11. A bipolar transistor as defined in claim 10, wherein said base contact extension layer is in lateral contact with said base layer, and wherein said collector contact extension layer is in contact with the bottom surface of said collector layer.

12. A bipolar transistor as defined in claim 11, wherein said another side is on an opposite side of said emitter layer from said one side.

13. A bipolar transistor as defined in claim 12, wherein the bottom surface of said base contact extension layer is above the top surface of said collector contact extension layer.

14. A bipolar transistor as defined in claim 9, wherein said first and second sidewall insulating layers include a concentration of dopant of the same conductivity type as the base dopant disposed along the edges thereof adjacent to said base layer.

15. A bipolar transistor as defined in claim 9, wherein said collector contact extension layer includes a first portion thereof disposed directly below said collector layer with a first dopant concentration, and a second portion thereof with a second dopant concentration which is greater than said first dopant concentration disposed directly below the top surface of said collector contact extension layer in the volume thereof which extends laterally to one side of said collector layer.

16. A bipolar transistor as defined in claim 10, further comprising a region of semiconductor material of the same dopant type as said base layer but with a greater dopant concentration than said base layer disposed laterally adjacent to said one side of said base layer to prevent base edge inversion.

* * * * *